(12) United States Patent
Funakawa

(10) Patent No.: US 9,179,015 B2
(45) Date of Patent: Nov. 3, 2015

(54) IMAGE FORMING APPARATUS

(71) Applicant: Hisataka Funakawa, Toyokawa (JP)

(72) Inventor: Hisataka Funakawa, Toyokawa (JP)

(73) Assignee: KONICA MINOLTA BUSINESS TECHNOLOGIES, INC., Chiyoda-Ku, Tokyo (JP)

( * ) Notice: Subject to any disclaimer, the term of this patent is extended or adjusted under 35 U.S.C. 154(b) by 219 days.

(21) Appl. No.: 13/633,984

(22) Filed: Oct. 3, 2012

(65) Prior Publication Data

US 2013/0083344 A1   Apr. 4, 2013

(30) Foreign Application Priority Data

Oct. 4, 2011   (JP) .................................. 2011-220194

(51) Int. Cl.
*G06K 15/02* (2006.01)
*H04N 1/00* (2006.01)
*H03K 17/96* (2006.01)

(52) U.S. Cl.
CPC ......... *H04N 1/00127* (2013.01); *H03K 17/962* (2013.01); *H04N 1/00896* (2013.01); *H03K 2017/9606* (2013.01); *H03K 2217/960745* (2013.01); *H04N 1/00384* (2013.01); *H04N 1/00411* (2013.01); *H04N 2201/0094* (2013.01)

(58) Field of Classification Search
None
See application file for complete search history.

(56) References Cited

U.S. PATENT DOCUMENTS

| | | | |
|---|---|---|---|
| 5,822,246 A * | 10/1998 | Taub et al. ................ | 365/185.18 |
| 8,416,468 B2 * | 4/2013 | Underwood et al. ......... | 358/474 |
| 2004/0004732 A1 * | 1/2004 | Takeda et al. ................ | 358/1.13 |
| 2009/0122362 A1 * | 5/2009 | Hirai .............................. | 358/474 |
| 2010/0079508 A1 * | 4/2010 | Hodge et al. .................. | 345/697 |
| 2010/0231390 A1 | 9/2010 | Hashimoto | |
| 2010/0260506 A1 * | 10/2010 | Naruse .............................. | 399/9 |
| 2011/0090524 A1 | 4/2011 | Nishio | |

(Continued)

FOREIGN PATENT DOCUMENTS

| | | |
|---|---|---|
| CN | 101860639 A | 10/2010 |
| JP | 2002-071833 A | 3/2002 |
| JP | 2006-251194 A | 9/2006 |

(Continued)

OTHER PUBLICATIONS

Office Action (Notice of Grounds of Rejection) issued on Oct. 22, 2013, by the Japanese Patent Office in corresponding Japanese Patent Application No. 2011-220194, and an English Translation of the Office Action. (8 pages).

(Continued)

*Primary Examiner* — Ashish K Thomas
(74) *Attorney, Agent, or Firm* — Buchanan Ingersoll & Rooney PC

(57) ABSTRACT

An image forming apparatus has, as operation modes, a normal mode and a power-saving mode with power consumption smaller than the normal mode. The image forming apparatus includes an operation unit for receiving an instruction from a user, having an operation area to which a prescribed instruction from the user is input. The image forming apparatus further includes: a first detection unit detecting an input from the user to the operation area in the normal mode; a power control unit controlling power supply in the normal mode and the power-saving mode, and turning off power supply to the first detection unit in the power-saving mode; and a second detection unit detecting an input from the user to the operation area in the power-saving mode.

12 Claims, 11 Drawing Sheets

(56) References Cited

U.S. PATENT DOCUMENTS

2012/0327447 A1* 12/2012 Funakawa .................... 358/1.13
2013/0135198 A1* 5/2013 Hodge et al. .................. 345/156

FOREIGN PATENT DOCUMENTS

| JP | 2008-107686 A | 5/2008 |
| JP | 2010-217303 A | 9/2010 |

OTHER PUBLICATIONS

Office Action from Chinese Patent Office dated Aug. 7, 2014, issued in corresponding Chinese Patent Application No. 201210366652.8, with English translation thereof. (11 pages).

European Search Report issued Aug. 7, 2015 by the European Patent Office, in the corresponding European Application No. 12186948.1 (6 pages).

* cited by examiner

IMAGE FORMING APPARATUS

This application is based on Japanese Patent Application No. 2011-220194 filed with the Japan Patent Office on Oct. 4, 2011, the entire content of which is hereby incorporated by reference.

BACKGROUND OF THE INVENTION

1. Field of the Invention

The present invention relates to an image forming apparatus controlling transition to a power-saving mode.

2. Description of the Related Art

Conventionally, power control for reducing power consumption has been done such that if an image forming apparatus is not used for a prescribed time period, transition to a low-power-consumption mode is made in which power supply to part of the apparatus is stopped. In the low-power-consumption mode, if a user operation is received through an operation panel of the apparatus, the low-power-consumption mode is cancelled and transition to a normal mode takes place. Such a transition is made possible by constantly scanning a touch panel or keys on the operation panel using a detection circuit arranged in the operation panel to detect a user operation. Recently, however, in order to further reduce power consumption in the low-power-consumption mode, power supply to the detection circuit is also stopped. In this case, the low-power-consumption mode cannot be cancelled by the user operation through the operation panel. Therefore, a method of cancelling the power-saving mode based on a detection result of a separately provided human body detection sensor has been proposed.

By way of example, Japanese Laid-Open Patent Publication No. 2006-251194 proposes a method in which a mat switch is provided on the floor in front of an image forming apparatus, and when a user coming to and standing in front of the apparatus is detected, the power-saving mode is cancelled.

According to the technique disclosed in Japanese Laid-Open Patent Publication No. 2006-251194, however, though it is possible to cancel the power-saving mode depending on whether a user is standing in front of the image forming apparatus, it is impossible to determine whether the user operates the apparatus or not. A method of providing a human body detection sensor near the operation panel may be possible. In that case, however, if detection distance is long, a person simply passing in front of the apparatus may be erroneously detected. If the detection distance is short, detectable range becomes narrow, so that detection of a user operation with respect to the entire surface of operation area possibly fails. By arranging a plurality of directional detection sensors over the entire surface of operation panel, it becomes possible to detect any operation on the entire surface of the operation area. This approach, however, leads to increased cost and excessively large operation panel.

SUMMARY OF THE INVENTION

An object of the present invention is to provide an image forming apparatus capable of detecting a user operation with respect to the entire surface of operation area and thereby cancelling power-saving mode without increasing the size of the apparatus.

According to an aspect, the present invention provides an image forming apparatus having, as operation modes, a normal mode and a power-saving mode with power consumption smaller than the normal mode, including: an operation unit for receiving an instruction from a user, the operation unit having an operation area to which a prescribed instruction from the user is input; a first detection unit, arranged corresponding to the operation area, for detecting an input from the user to the operation area in the normal mode; a power control unit controlling power supply in the normal mode and the power-saving mode, and turning off power supply to the first detection unit in the power-saving mode; and a second detection unit for detecting an input from the user to the operation area in the power-saving mode.

Preferably, the operation unit has a plurality of operation areas; and the second detection unit is provided independently for each of the plurality of operation areas.

Preferably, the second detection unit includes a detection antenna and a detection circuit connected to the detection antenna; the detection antenna is provided close to and corresponding to each of the plurality of operation areas provided in the operation unit; and the detection antenna detects an operating finger entering each of the plurality of operation areas of the operation unit.

Preferably, the second detection unit includes a detection antenna and a detection circuit connected to the detection antenna; the operation unit has a first operation area provided with a touch-panel, and a second operation area provided with a prescribed group of keys; the detection antenna is arranged to surround outer peripheries of the first and second operation areas; and the detection antenna detects an operating finger entering each of the first and second operation areas.

Preferably, the detection antenna is arranged such that the operating finger passes over the detection antenna, considering direction of the operating finger entering the operation area.

Preferably, the second detection unit includes a detection antenna and a detection circuit connected to the detection antenna; the operation unit has a first operation area provided with a first group of keys and a second operation area provided with a second group of keys; and the detection antenna detects an operating finger entering the first and second operation areas.

Preferably, the second detection unit includes a detection antenna and a detection circuit connected to the detection antenna; the operation unit has a first operation area provided with a touch panel and a second operation area provided with a prescribed group of keys; and the detection antenna has a first sub detection antenna arranged to surround an outer periphery of the first operation area, and a second sub detection antenna arranged to surround an outer periphery of the second operation area except for a side adjacent to the first operation area.

Preferably, the second detection unit includes a detection antenna and a detection circuit connected to the detection antenna; the operation unit has a first operation area provided with a touch panel and a second operation area provided with a prescribed group of keys; and the detection antenna has a first sub detection antenna arranged to surround an outer periphery of the first operation area, and a second sub detection antenna arranged opposite to the first sub detection antenna so that the second operation area is positioned between these sub detection antennas.

Particularly, the first operation area provided with the touch-panel is configured to be slidable.

Particularly, the detection antenna is formed on the same printed circuit board as the first detection unit.

Particularly, the detection antenna is formed of a wire-like conductive body; and the detection antenna is arranged to be adhered to a resin case covering a printed circuit board on which the first detection unit is provided.

Preferably, the image forming apparatus further has, as the operation mode, a second power-saving mode with power consumption smaller than the normal mode and larger than the power-saving mode; the operation unit has a display unit for displaying information; and the power control unit supplies power to the first detection unit and turns off power supply to the display unit, in the second power-saving mode.

Preferably, the power control unit turns off power supply to the second detection unit in the normal mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
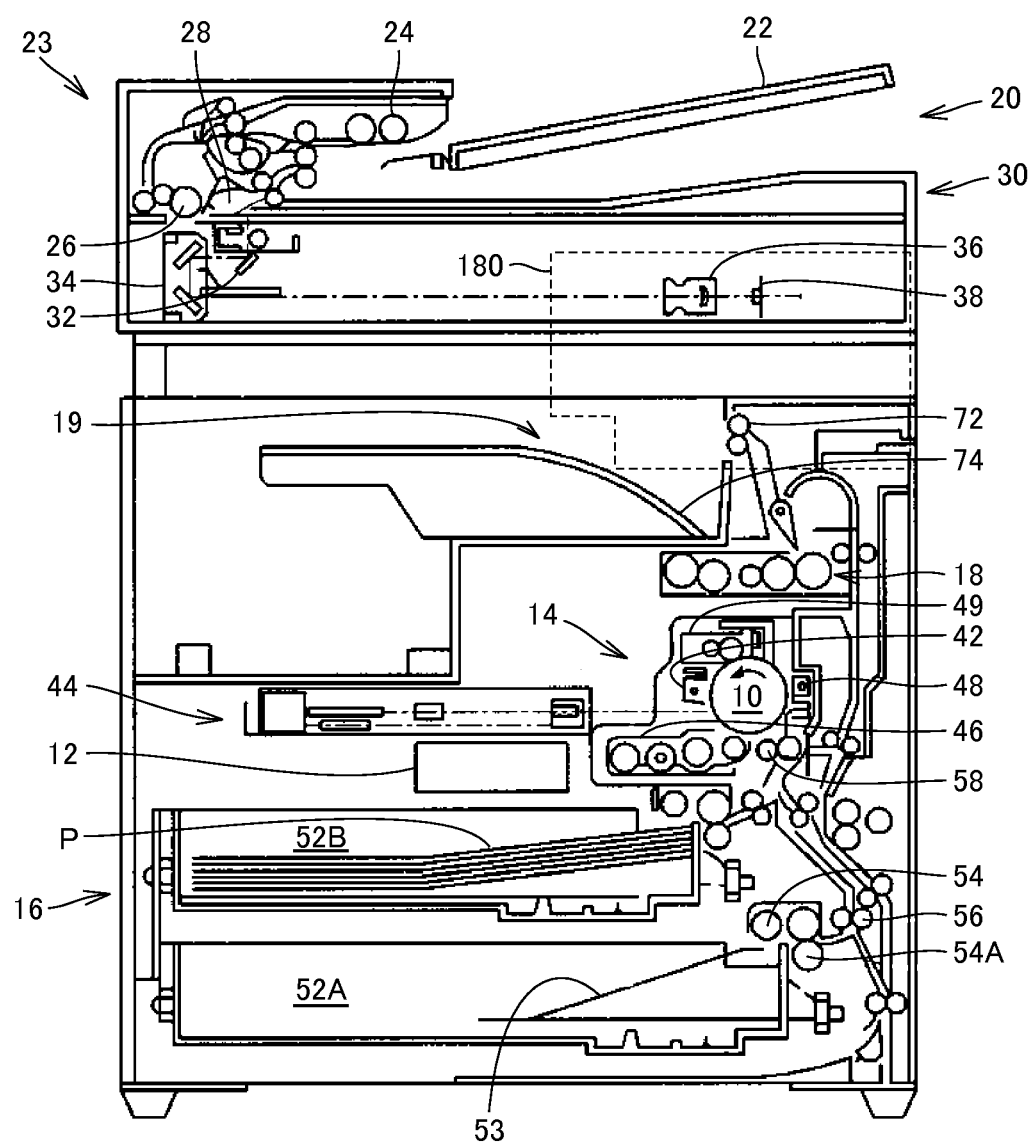
FIG. 1 is a schematic cross-sectional view from the front side of an image forming apparatus 1 in accordance with an embodiment of the present invention.

The embodiment of the present invention will be described in detail with reference to the figures. In the figures, the same or corresponding portions are denoted by the same reference characters and description thereof will not be repeated.

<Overall Configuration>

First, an overall configuration of the image forming apparatus in accordance with the embodiment of the present invention will be described. The image forming apparatus is a digital multi-functional peripheral having, for example, a document feeding function for successively feeding a plurality of documents and a re-conveying function to enable automatic double-sided copying.

FIG. 1 is a schematic cross-sectional view from the front side of an image forming apparatus 1 in accordance with the embodiment of the present invention.

Referring to FIG. 1, image forming apparatus 1 in accordance with the embodiment of the present invention includes an image processing unit 12, an image forming unit 14, a paper feed unit 16, a fixing device 18, and a paper discharge unit 19. On an upper portion of the body of image forming apparatus 1, an automatic document feeder 20 and an image reading unit 30 are mounted.

Automatic document feeder 20 includes a platen 22, an automatic feeding unit 23, and a conveyer roller 24. On platen 22 of automatic document feeder 20, a document, not shown, is placed with its surface to be copied facing upward. Conveyer roller 24 picks up and feeds the documents one by one successively, and the document is fed to automatic feeding unit 23.

At the trailing end of conveyer path, a register roller 26 as a skew correction unit is provided. Register roller 26 rotates in synchronization with scanning timing of image reading unit 30, so that the document is fed to pass over a slit glass 28.

Image reading unit 30 includes a first scanning unit 32, a second scanning unit 34, an image forming lens 36 and an image pick-up device 38 such as a CCD. First scanning unit 32 includes a light source for directing light to the document through slit glass 28, and a mirror. Second scanning unit 34 includes two mirrors guiding reflected light to image forming lens 36.

First scanning unit 32 directs light to a document when the document passes over slit glass 28 arranged above image reading unit 30 and receives light reflected from the document. The reflected light enters image pick-up element 38 through second scanning unit 34 and image forming lens 36. Specifically, first scanning unit 32, second scanning unit 34 and image forming lens 36 form an image that is printed on the document on image pick-up device 38 and thereby read the image printed on the document.

Image processing unit 12 generates image data based on an electric signal from image pick-up device 38. Specifically, image processing unit 12 performs image processing based on the electric signal from image pick-up device 38. More specifically, image processing unit 12 generates image data (digital data) representing the image based on the electric signal (analog signal) from image pick-up device 38, and temporarily stores the image data in a storage unit 110, which will be described later.

Image forming unit 14 includes an image carrier 10, a charger 42, an image writing unit 44, a developer 46, and a transfer device 48. Charger 42 is arranged along an outer circumference of image carrier 10. As image carrier 10 rotates along charger 42, charger 42 substantially uniformly charges the surface of image carrier 10. Image writing unit 44 forms an electrostatic latent image on the surface of image carrier 10. Developer 46 forms a toner image by developing the electrostatic latent image. Transfer device 48 transfers the toner image on the surface of image carrier 10 to a sheet of transfer paper P. A cleaning device 49 cleans the surface of image carrier 10 after transfer.

On the other hand, paper feed unit 16 includes a paper feed cassette 52 (52A, 52B). Paper feed cassette 52 contains sheets of transfer paper P. In paper feed cassette 52, a movable plate 53 is arranged. Movable plate 53 has its free end always urged upward by an energizing means such as a plate spring. Because of such a structure, of the plurality of sheets of transfer paper P placed on movable plate 53, the uppermost sheet P is brought into contact with pick-up roller 54.

Pick-up roller 54 discharges the sheet of transfer paper P that is in contact with pick-up roller 54 from paper feed cassette 52. A separation roller 54A separates a plurality of sheets of transfer paper P one by one. A plurality of intermediate rollers 56 guide the sheet of transfer paper P and feed the sheet of transfer paper P to a lower register roller 58. Lower register roller 58 feeds the sheet of transfer paper P to transfer device 48 timed with the paper feeding timing.

As described above, transfer device 48 transfers the toner image formed in image carrier 10 to the sheet of transfer paper P. The sheet of transfer paper P having the toner image transferred thereon is conveyed to fixing device 18. Fixing device 18 performs a toner image fixing process on the sheet of transfer paper P. Thereafter, paper discharge roller 72 pinches the sheet of transfer paper P and thereby discharges the sheet of transfer paper P to the outside of image forming apparatus 1. Specifically, the sheet of transfer paper P having the image printed thereon is placed on a discharge tray 74.

Further, an operation panel 300 is provided on a front surface of image forming apparatus 1, to receive various instructions of the user to image forming apparatus 1.

<Hardware Configuration>

Next, hardware configuration of image forming apparatus 1 in accordance with the present embodiment will be described.

Figure 2:
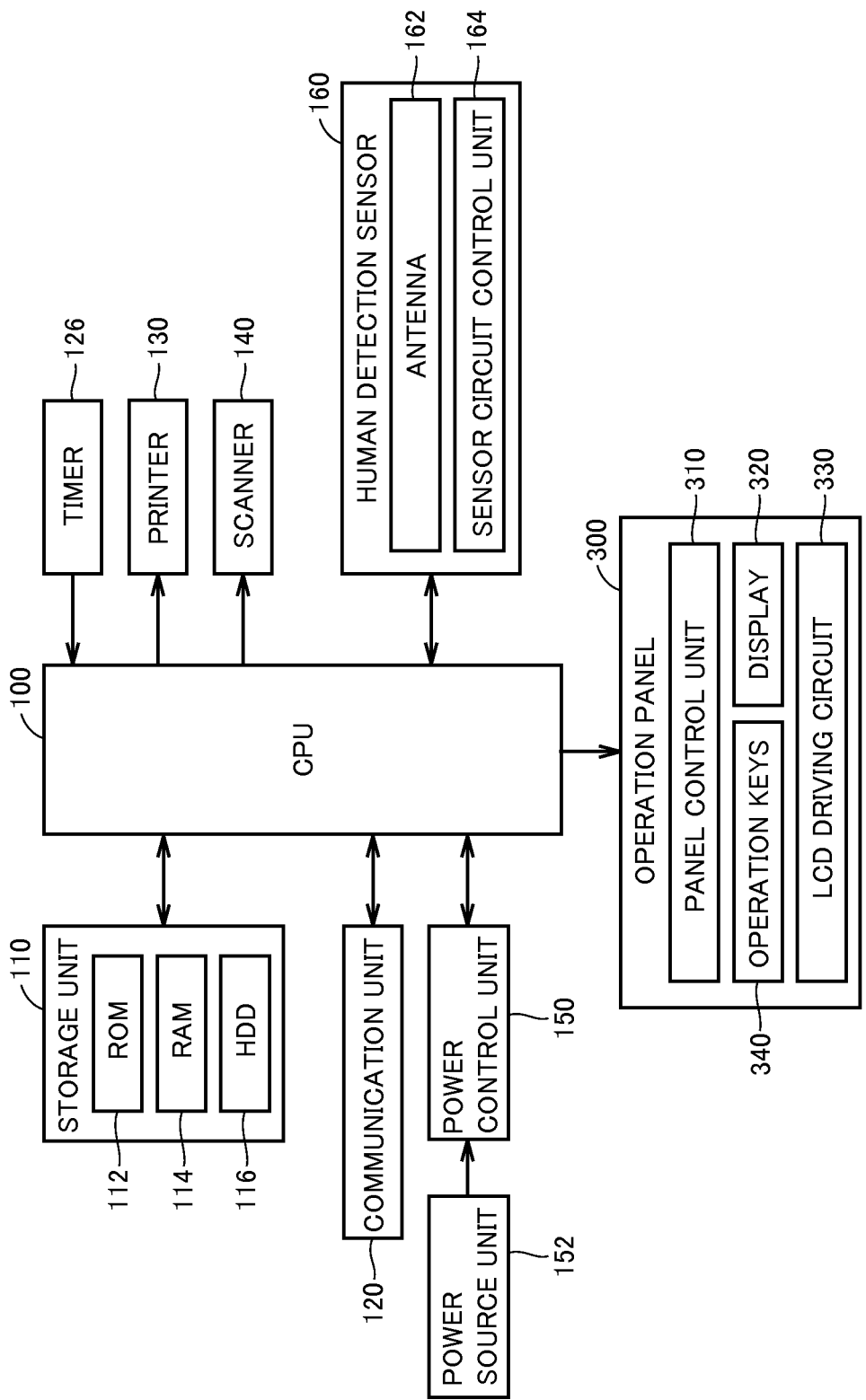
FIG. 2 is a block diagram showing a hardware configuration of image forming apparatus 1 in accordance with the embodiment of the present invention.

FIG. 2 is a block diagram showing a hardware configuration of image forming apparatus 1 in accordance with the embodiment of the present invention.

Referring to FIG. 2, image forming apparatus 1 includes a CPU (Central Processing Unit) 100, a storage unit 110, a communication unit 120, a timer 126, a printer 130, a scanner 140, a power control unit 150, a power source unit 152, a human detection sensor 160, and operation panel 300.

CPU 100 reads a program stored in advance in a nonvolatile memory of storage unit 110, which will be described later, successively executes the program and thereby controls various units and portions of image forming apparatus 1. More specifically, CPU 100 executes the program and thereby realizes the process, which will be described later, of image forming apparatus 1.

Storage unit 110 is implemented, for example, by a non-volatile memory such as an ROM (Read Only Memory) 112, an RAM (Random Access Memory) 114 or an HDD (Hard Disk Drive) 116. ROM 112 stores in advance a program or programs to be executed by CPU 100, and RAM 114 temporarily stores data necessary for CPU 100 to execute portions of the program. HDD 116 is capable of storing relatively large amount of data in non-volatile manner and stores, for example, a plurality of image data obtained through image reading by scanner 140, which will be described later.

Communication unit 120 is implemented, for example, by a network interface. Communication unit 120 transmits/receives image data and the like to and from a personal computer, a server and the like through a network, in accordance with a prescribed protocol. By way of example, communication unit 120 receives an authenticated print process from the user.

Timer 126 is a section for keeping time, and it sends a signal in accordance with the kept time to CPU 100. Based on the signal, CPU 100 can execute a predetermined process, for example, at a constant time interval.

Printer 130 prints an image on a sheet of transfer paper P based on image data. Printer 130 includes, as main components, image processing unit 12, image forming unit 14, paper feed unit 16, fixing device 18 and paper discharge unit 19.

Scanner 140 optically reads a document to obtain image data, and stores the data in storage unit 110. Scanner 140 includes, as a main component, image reading unit 30.

Power control unit 150 controls power supply in image forming apparatus 1 such that power from power source unit 152 is supplied to substantially all parts of image forming apparatus 1 (normal mode) or supplies power to only some of the parts of image forming apparatus 1 (power-saving move) in response to an instruction from CPU 100.

For example, in the power-saving mode, power control unit 150 stops power supply from power source unit 152 to a panel control unit 310, which will be described later, to reduce power consumption.

Power source unit 152 includes a circuit for converting AC voltage to DC voltage, and operates image forming apparatus 1 with the converted DC voltage.

Human detection sensor 160 is arranged on operation panel 300, which will be described later, and it detects presence/absence of a human body in a prescribed detection range. By way of example, human detection sensor 160 is formed of a capacitance sensor, and it includes a detection electrode (antenna 162) and a sensor circuit control unit 164, which will be described later. Specifically, a change in capacitance detected by antenna 162 is converted by sensor circuit control unit 164 to a detection signal, and the signal is output to CPU 100. If human detection sensor 160 detects a user in the power-saving mode, CPU 100 cancels the power-saving mode, and causes image forming apparatus 1 to enter the normal mode. Though human detection sensor 160 implemented by a capacitance sensor is described as an example here, it is not limited to a capacitance sensor, and it may be any sensor that has a function of detecting a human body, such as an infrared sensor, an ultrasonic sensor or other human detection sensor.

Operation panel 300 includes a panel control unit 310, a display 320 as a liquid crystal display, an LCD (Liquid Crystal Display) driving circuit 330, and operation keys 340 for receiving operation inputs from the user. It is noted, however, that display 320 may be an organic EL display and LCD driving circuit 330 may be an organic EL display driving circuit. Human detection sensor 160 is arranged at a prescribed portion of operation panel 300, as will be described in detail later.

Figure 3:
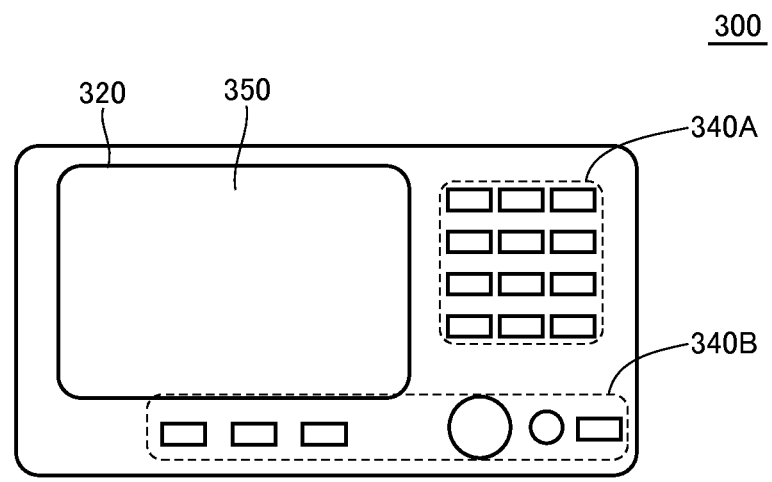
FIG. 3 shows an example of an appearance of an operation panel 300 in accordance with the embodiment of the present invention.

FIG. 3 shows an example of an appearance of an operation panel 300 in accordance with the embodiment of the present invention.

Referring to FIG. 3, on display 320 of operation panel 300, a touch-panel 350 is attached, allowing the user to execute settings and display of various modes. Operation keys 340 (operation key groups 340A, 340B) include ten-keys for entering numerical values, a start key to start an operation such as copy/scan, a clear key for clearing entered numerical values, a stop key for stopping the copy/scan operation, and a reset key for cancelling set mode or job.

Figure 4:
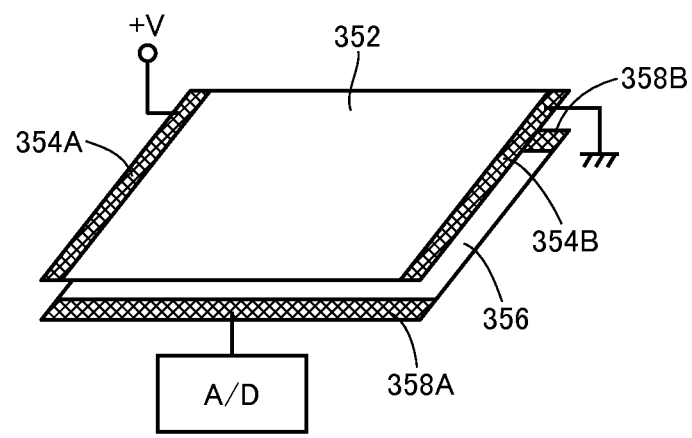
FIG. 4 is a schematic illustration showing a structure of a touch-panel 350 attached to a display 320 of operation panel 300 in accordance with the embodiment of the present invention.

FIG. 4 is a schematic illustration showing a structure of a touch-panel 350 attached to display 320 of operation panel 300 in accordance with the embodiment of the present invention.

Referring to FIG. 4, touch-panel 350 has such a structure that includes a film substrate 352 and a glass substrate 356 overlapped in parallel, and on each of opposing surfaces of film substrate 352 and glass substrate 356, a transparent conductive film of, for example, indium tin oxide, is formed. Usually, film substrate 352 and glass substrate 356 are apart from each other at a prescribed distance and, therefore, when pressed, for example, with a finger, these two are brought into contact and conduct electricity. In order to prevent unintentional contact due to deflection of the film caused by external factor, a spacer, not shown, is formed on a surface of glass substrate 356 facing film substrate 352.

Next, a method of detecting a user input to touch-panel 350 will be described.

On film substrate 352, X-electrodes 354A and 354B are provided on both left and right ends. On glass substrate 356, Y-electrodes 358A and 358B are provided on both upper and lower ends. Detection of an X coordinate is as follows. When a prescribed voltage V is applied to X-electrode 354A and X-electrode 354B is grounded, a potential gradient is formed because of the resistance of transparent conductive film, in the X-direction of film substrate 352. When the potential of a contact point is detected by an A/D converter using glass substrate 356, the X coordinate can be detected by voltage division. Similarly, by applying prescribed voltage to Y electrodes 358A and 358B utilizing a switch, not shown, the Y coordinate can also be detected.

Figure 5:
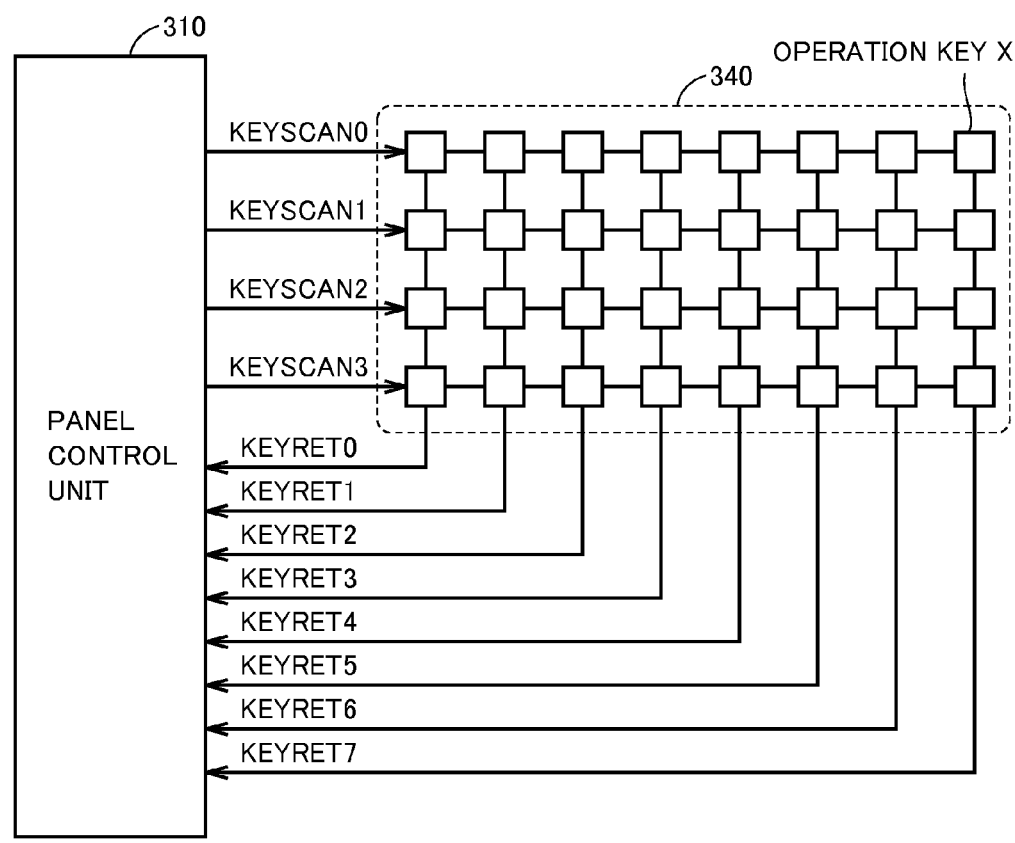
FIG. 5 shows an example of a schematic configuration of a detection unit corresponding to an operation key 340 of operation panel 300 in accordance with the embodiment of the present invention.

FIG. 5 shows an example of a schematic configuration of a detection unit corresponding to operation keys 340 of operation panel 300 in accordance with the embodiment of the present invention.

Referring to FIG. 5, the detection unit of operation keys 340 is implemented by a matrix circuit having 4×8 wires in rows and columns and operation keys on respective intersections of the wires, and a panel control unit 310 having four output ports connected to respective wires in the row direction and eight input ports connected to respective wires in the column direction of the matrix circuit. From respective output ports, respective scan signals (KEYSCAN 0 to KEYSCAN 3) are successively output, and by reading voltages of detection signals input to corresponding input ports, respectively, it is possible to detect which operation key 340 is pressed. For instance, if scan signal KEYSCAN 0 outputs an "H" level and the user presses operation key X, the voltage of detection signal KEYRET7 corresponding to the operated key X attains to the "L" level and the voltages of detection signals KEYRET0 to KEYRET6 attain to the "H" level. Therefore, it can be detected that the user pressed operation key X.

<Operation Modes>

Next, operation modes of image forming apparatus 1 in accordance with the present embodiment will be described.

Figure 6:
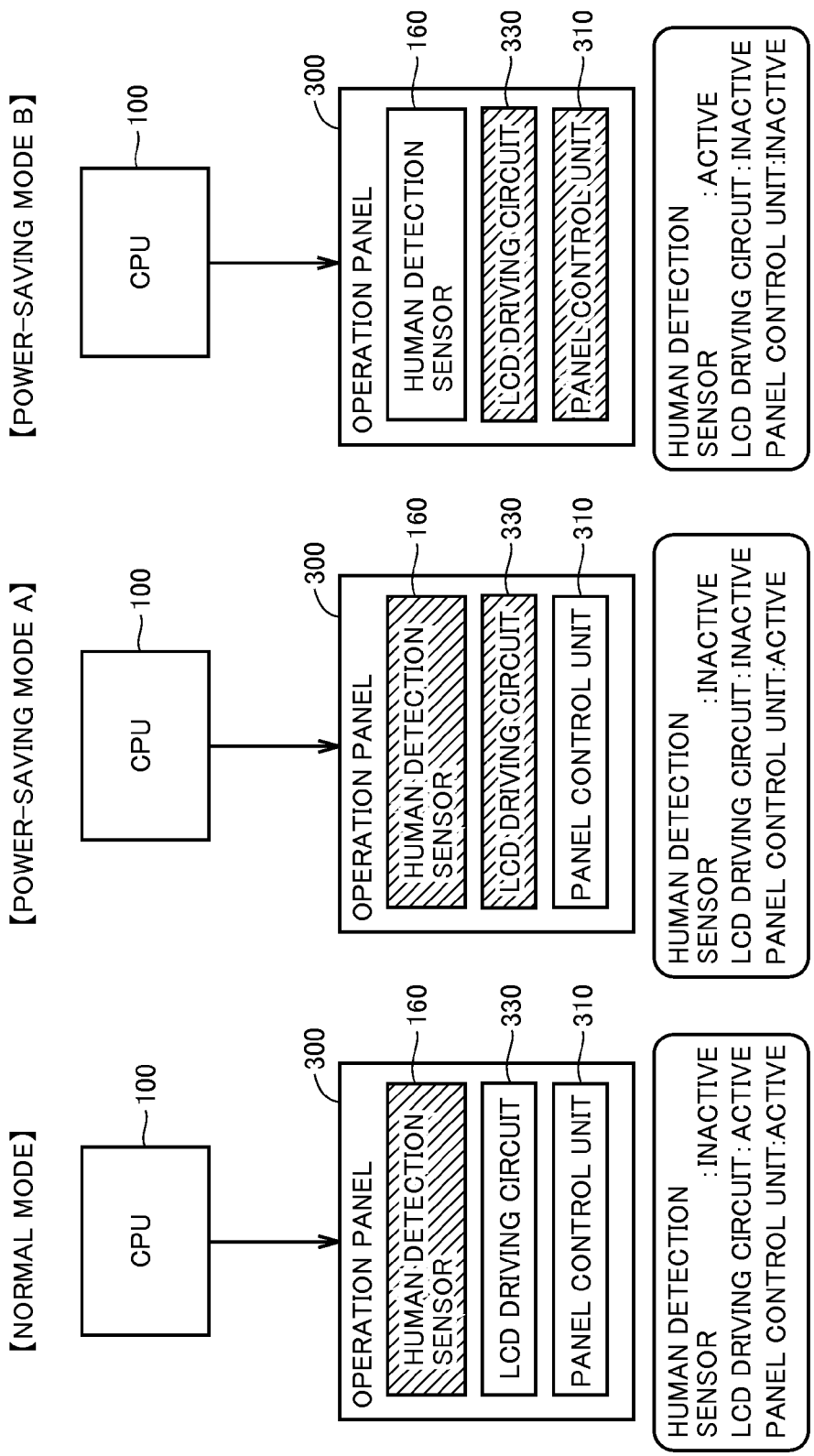
FIG. 6 illustrates contents of power control in the normal mode and the power-saving mode on operation panel 300 in accordance with the embodiment of the present invention.

FIG. 6 illustrates contents of power control in the normal mode and the power-saving mode on operation panel 300 in accordance with the embodiment of the present invention.

Referring to FIG. 6, first, contents of power control in the normal mode will be described.

In the normal mode, CPU 100 instructs power control unit 150 to stop power supply to human detection sensor 160 arranged on operation panel 300, and supply power to other portions. The reason is as follows. In the normal mode, the user operates operation panel 300 to enable execution of functions provided by image forming apparatus 1, and the necessity to detect the user by human detection sensor 160 is low. Therefore, this approach is taken to reduce power consumption of image forming apparatus 1. At this time, since power is supplied to panel control unit 310, image forming apparatus 1 is capable of detecting a user input to operation keys 340 or touch-panel 350, and since power is also supplied to LCD driving circuit 330, the user can visually recognize various pieces of information on display 320.

Next, contents of power control in a power-saving mode A will be described.

In power-saving mode A, CPU 100 instructs power control unit 150 to stop power supply to human detection sensor 160 arranged on operation panel 300 and to LCD driving circuit 330, and to supply power to panel control unit 310. The reason is as follows. The power-saving mode A is a transitional phase between the normal mode and a power-saving mode B, which is an operation mode of lower power consumption. Therefore, power supply to LCD driving circuit 330, which consumes much power, is stopped, as compared with the normal mode. At this time, since power is supplied to panel control unit 310, image forming apparatus 1 is capable of detecting a user input to operation keys 340 or touch-panel 350, and if such an input is detected, CPU 100 causes image forming apparatus 1 to make a transition to the normal mode.

Next, contents of power control in the power-saving mode B will be described.

In power-saving mode B, CPU 100 instructs power control unit 150 to stop power supply to panel control unit 310 arranged on operation panel 300 and to LCD driving circuit 330, and to supply power to human detection sensor 160. This is to further reduce power consumption of image forming apparatus 1. At this time, power is not supplied to panel control unit 310. Therefore, any user input to operation keys 340 or touch-panel 350 is not detected. However, since power is supplied to human detection sensor 160, it is possible to detect a user in a prescribed detection range. When a user is detected by human detection sensor 160, CPU 100 causes image forming apparatus 1 to make a transition to the normal mode.

Next, the operation mode transition process of image forming apparatus 1 will be described.

Figure 7:
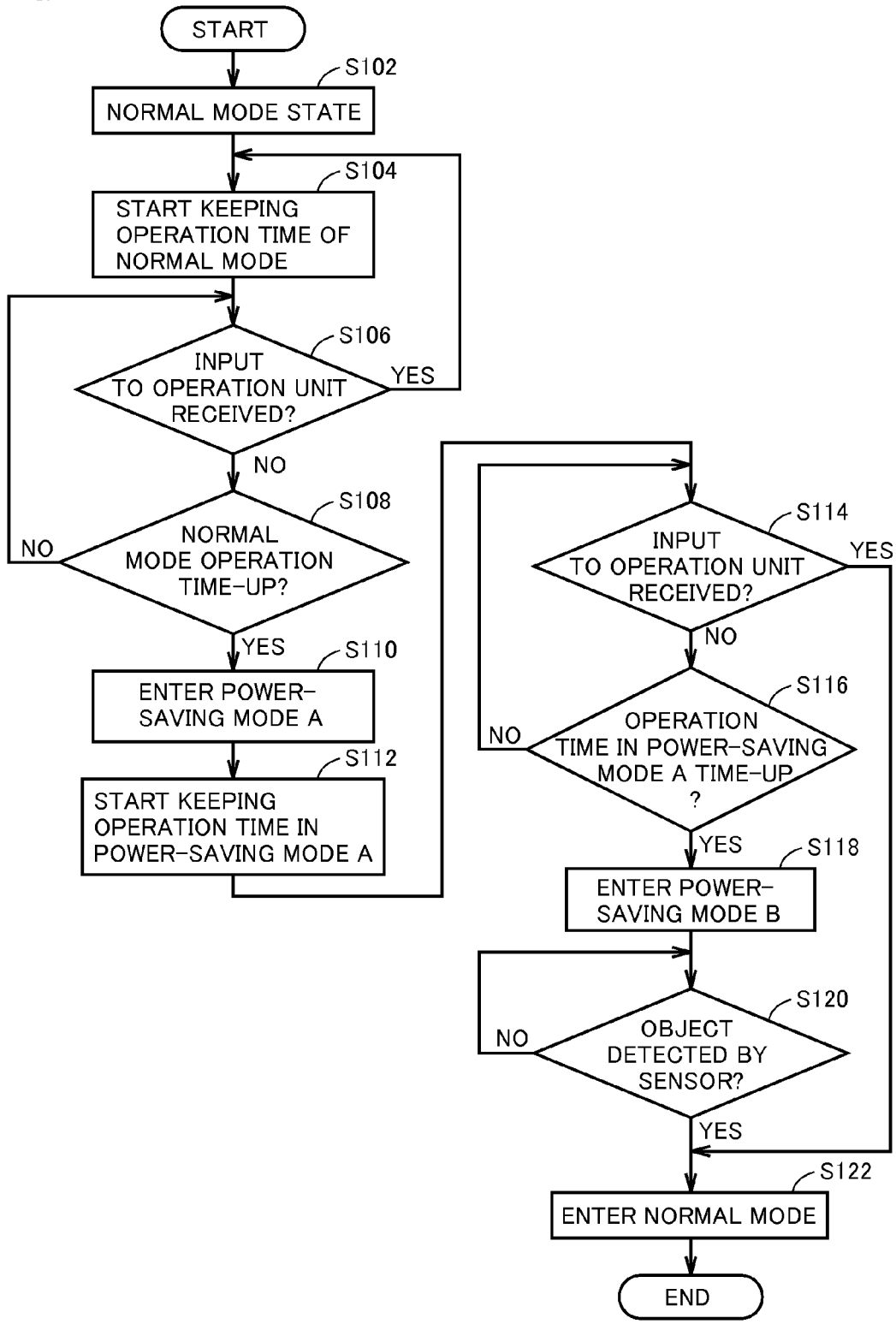
FIG. 7 is a flowchart representing the operation mode transition process in image forming apparatus 1 in accordance with the embodiment of the present invention.

FIG. 7 is a flowchart representing the operation mode transition process in image forming apparatus 1 in accordance with the embodiment of the present invention.

Referring to FIG. 7, in the normal mode (step S102), in order to keep the time of normal mode operation state of image forming apparatus 1, timer 126 starts keeping operation time of normal mode in accordance with an instruction from CPU 100 (step S104).

Next, operation panel 300 determines whether or not an input instruction from the user has been received, based on the result of detection of panel control unit 310 (step S106). If it is determined by operation panel 300 that an input instruction from the user is received (YES at step S106), timer 126 returns to step S104 to restart keeping operation time of normal mode, in accordance with an instruction from CPU 100. On the other hand, if it is determined by operation panel 300 that an input instruction from the user is not received (NO at step S106), timer 126 continues keeping operation time of normal mode in accordance with an instruction from CPU 100.

Next, CPU 100 determines whether or not the normal mode operation time kept by timer 126 reached a pre-set time (step S108). If it is determined by CPU 100 that the normal mode operation time has not yet reached the pre-set time (NO at step S108), the process from step S106 is repeated. On the other hand, if it is determined that the normal mode operation time has reached the pre-set time (YES at step S108), CPU 100 causes image forming apparatus 1 to make a transition from the normal mode to power-saving mode A (step S110). Specifically, in accordance with an instruction from CPU 100, power control unit 150 executes power control of power-saving mode A described above.

Next, in order to keep the operation time in power-saving mode A of image forming apparatus 1, timer 126 starts keeping operation time in power-saving mode A in accordance with an instruction from CPU 100 (step S112).

Next, operation panel 300 determines whether or not an input instruction from the user has been received, based on the result of detection of panel control unit 310 (step S114). If it is determined by operation panel 300 that an input instruction from the user is received (YES at step S114), CPU 100 causes image forming apparatus 1 to make a transition from power-saving mode A to the normal mode (step S122), and the process ends. Specifically, in accordance with an instruction from CPU 100, power control unit 150 executes power control of normal mode. On the other hand, if it is determined by operation panel 300 that an input instruction from the user is not received (NO at step S114), timer 126 continues keeping operation time in power-saving mode A in accordance with an instruction from CPU 100.

Next, CPU 100 determines whether or not the operation time in power-saving mode A kept by timer 126 reached a pre-set time (step S116). If it is determined by CPU 100 that the operation time in power-saving mode A has not yet reached the pre-set time (NO at step S116), the process from step S114 is repeated. On the other hand, if it is determined that the operation time in power-saving mode A has reached the pre-set time (YES at step S116), CPU 100 causes image forming apparatus 1 to make a transition from power-saving mode A to power-saving mode B (step S118). Specifically, in accordance with an instruction from CPU 100, power control unit 150 executes power control of power-saving mode B described above.

Next, CPU 100 determines whether or not a human body is detected, based on the result of detection of human body sensor 160 (step S120). If it is determined that human body is not detected (NO at step S120), CPU 100 maintains the state of step S120, and hence, maintains power-saving mode B. On the other hand, if t is determined that human body is detected (YES at step S120), CPU 100 causes image forming apparatus 1 to make a transition from power-saving mode B to the normal mode (step S122), and the process ends.

<Outline of Human Detection Sensor>

Next, outline of human detection sensor 160 will be described.

Figure 8:
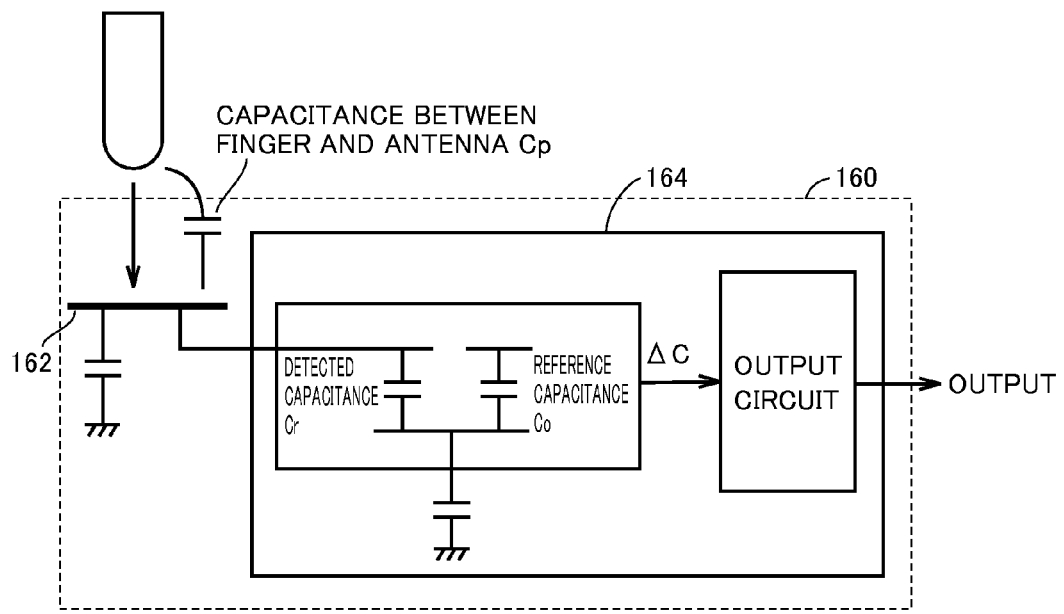
FIG. 8 is a schematic illustration showing a configuration of a human detection sensor 160 in accordance with the embodiment of the present invention.

FIG. 8 is a schematic illustration showing a configuration of a human detection sensor 160 in accordance with the embodiment of the present invention.

Referring to FIG. 8, human detection sensor 160 is a capacitance sensor having a detection electrode (antenna 162) on a part of the circuit, and a change in capacitance of the electrode caused by an object approaching to antenna 162 is converted to an electric signal, to detect an approach of a human body. Briefly described, human detection sensor 160 has a detection capacitance Cr and a reference capacitance Co therein, and by comparing detection capacitance Cr and reference capacitance Co, a change ΔC in capacitance is detected. For instance, if an operating finger of the user comes close to antenna 162, capacitance of capacitance Cp between the operating finger and antenna 162 increases and therefore, by comparing (Cp+Cr) with reference capacitance Co, ΔC is detected. Because of the change in capacitance of detected ΔC, an oscillator circuit in the sensor, not shown, oscillates and the current flowing through the circuit increases. If the increased current exceeds a preset current set value, a detection signal is output from an output circuit to CPU 100. Based on the detection signal, CPU 100 determines whether or not a human body is detected.

<Location of Arranging Human Detection Sensor>

Next, the location for arranging antenna 162 of human detection sensor 160 will be described.

Figure 9:
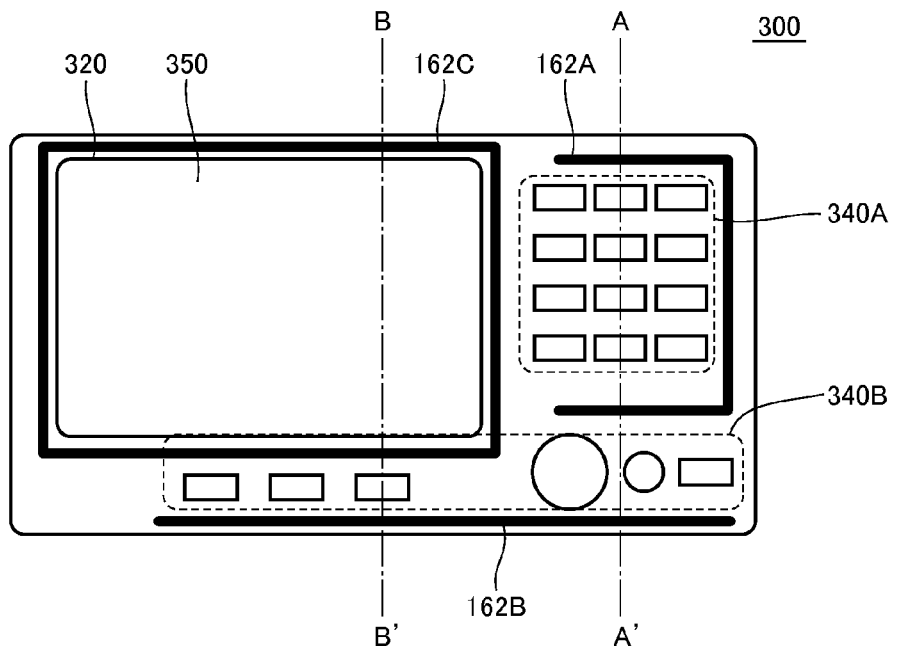
FIG. 9 shows an example of locations where antennas 162 are arranged corresponding to human detection sensor 160 in accordance with the embodiment of the present invention.

FIG. 9 shows an example of locations where antennas 162 are arranged corresponding to human detection sensor 160 in accordance with the embodiment of the present invention. The location where antenna 162 is arranged corresponding to human detection sensor 160 of FIG. 6 is not limited to this example, and various locations may be set in accordance with the manner of use by the user.

Referring to FIG. 9, operation panel 300 includes operation keys 340 (operation key group 340A, 340B), touch-panel 350 attached to display 320, and antennas 162A to 162C. Antennas 162A to 162C are each connected to human detection sensor 160, so that user operation can be detected by any of the antennas.

Antenna 162A is arranged in a rectangular shape with one side facing display 320 opened, to surround operation key group 340A. Human detection sensor 160 connected to antenna 162A can detect a user who is going to press operation key group 340A. The pattern of arrangement is not limited to the above, and antenna 162A may fully surround the four sides of operation key group 340A.

Antenna 162B is arranged on a lower side along operation key group 340B. Human detection sensor 160 connected to antenna 162B can detect a user who is going to press operation key group 340B. The pattern of arrangement is not limited to the above, and antenna 162B may fully surround the four sides of operation key group 340B.

Antenna 162C is arranged to surround an outer periphery of display 320. Human detection sensor 160 connected to antenna 162C can detect a user who is going to press touch-panel 350. The pattern of arrangement is not limited to the above, and antenna 162C may be arranged in a rectangular shape with one side opened, or in an L shape.

Though antennas 162A to 162C are connected to one human detection sensor 160 to detect a user input (operation) in the example above, independent human detection sensors may be provided for respective antennas. The same applies to the antennas described in the following.

Next, details of the location for arranging antenna 162 will be described.

Figure 10:
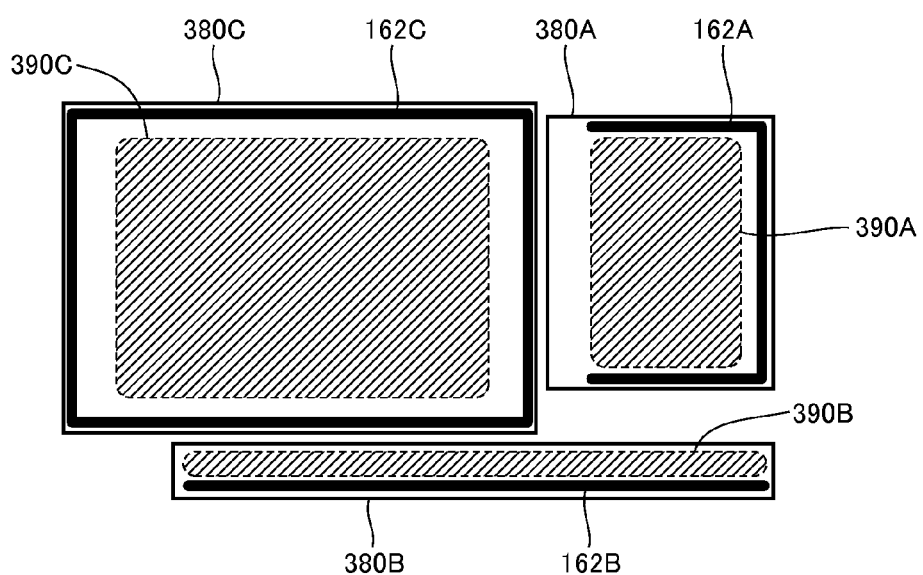
FIG. 10 shows a positional relation between antennas 162, operation key 340 and a detection unit 390 of touch-panel 350, arranged on a printed circuit board 380 of operation panel 300, in accordance with the embodiment of the present invention.

FIG. 10 shows a positional relation between antennas 162, operation key 340 and a detection unit 390 of touch-panel 350, arranged on a printed circuit board 380 of operation panel 300, in accordance with the embodiment of the present invention.

Referring to FIG. 10, on a printed circuit board 380A, antenna 162A and detection unit 390A are arranged. On a printed circuit board 380B, antenna 162B and detection unit 390B are arranged. On a printed circuit board 380C, antenna 162C and detection unit 390C are arranged. It is noted that antennas 162A to 162C are arranged along the outer periphery of printed circuit board 380, to prevent physical interference with detection units 390A to 390C.

Detection units 390A and 390B are provided for detecting user inputs to operation key groups 340A and 340B, respectively, and these units detect in accordance with the detection method described, for example, with reference to FIG. 5.

Detection unit 390C is for detecting a user input to touch-panel 350 and it detects in accordance with the method of detection described, for example, with reference to FIG. 4.

Next, the cross-sectional structure of operation panel 300 will be described.

Figure 11:
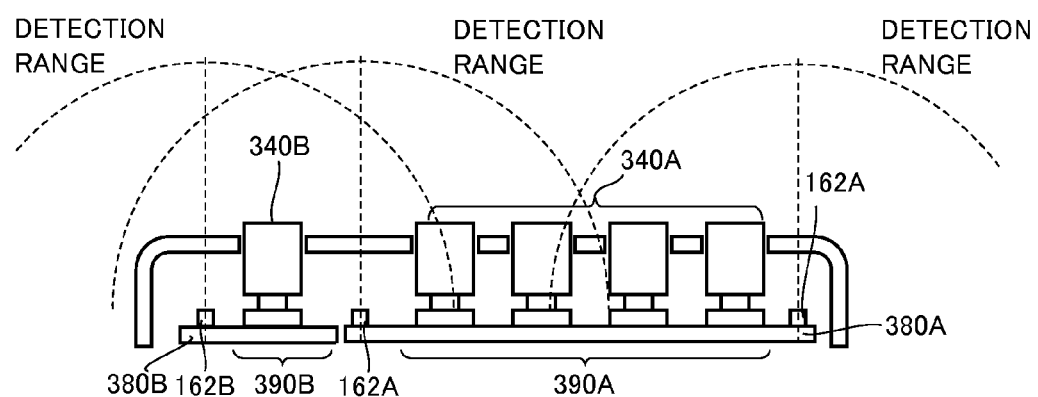
FIG. 11 is a schematic cross-sectional view of operation panel 300 along a line A-A' of FIG. 9.

FIG. 11 is a schematic cross-sectional view of operation panel 300 along a line A-A' of FIG. 9.

Referring to FIG. 11, antenna 162A is arranged not to physically interfere with detection unit 390A of operation key group 340A arranged on printed circuit board 380A. Further, antenna 162B is arranged not to physically interfere with detection unit 390B of operation key group 340B arranged on printed circuit board 380B. Detection range of human detection sensor 160 connected to antenna 162A is set to enable detection of a user who is going to press operation key group 340A, while detection range of human detection sensor 160 connected to antenna 162B is set to enable detection of a user who is going to press operation key group 340B.

Figure 12:
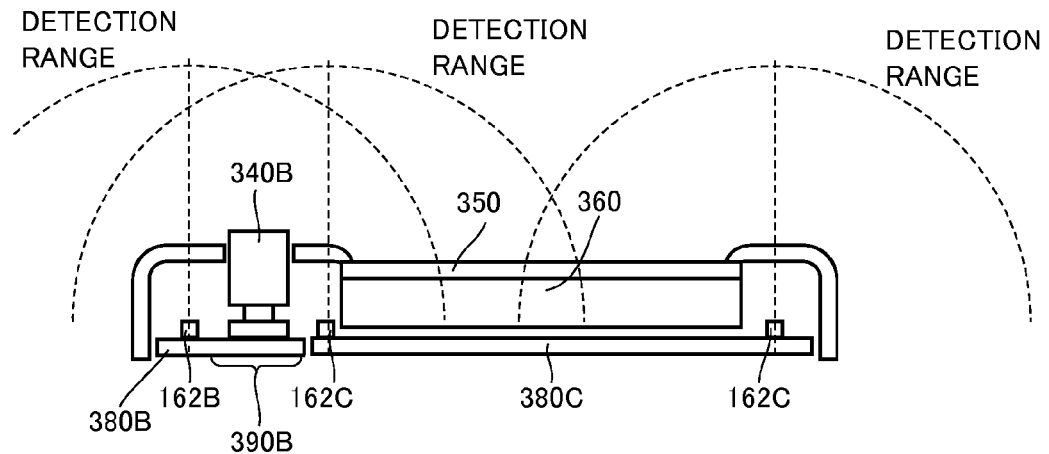
FIG. 12 is a schematic cross-sectional view of operation panel 300 along a line B-B' of FIG. 9.

FIG. 12 is a schematic cross-sectional view of operation panel 300 along a line B-B' of FIG. 9.

Referring to FIG. 12, an LCD module 360 is provided below touch panel 350 (in the direction to printed circuit board 380C), and below LCD module 360, printed circuit board 380C is provided. Antennas 162B and 162C are arranged not to physically interfere with LCD module 360 and detection unit 390B arranged on printed circuit board 380C. Detection range of human detection sensor 160 connected to antenna 162B is set to enable detection of a user who is going to press operation key group 340B. Similarly, detection range of human detection sensor 160 connected to antenna 162C is set to enable detection of a user who is going to press touch-panel 350.

From the foregoing, it is possible to arrange antenna 162 utilizing existing space of printed circuit board 380 of operation panel 300, and to detect human body by human detection sensor 160. Further, as described above, in the power-saving mode, power control unit 150 supplies power to human detection sensor 160 but does not supply power to panel control unit 310. Therefore, the function of panel control unit 310, that is, the function of detection unit 390, is disabled. Accordingly, noise caused by signal change generated when the function of detection unit 390 is active does not have any influence on antenna 162 of human detection sensor 160. Therefore, even though antenna 162 is arranged close to detection unit 390, detection accuracy of human detection sensor 160 can be maintained. Further, since antenna 162 can be arranged close to detection unit 390, it is unnecessary to provide a circuit board dedicated for the sensor and, hence, reduction in size of image forming apparatus 1 is possible.

Figure 13:
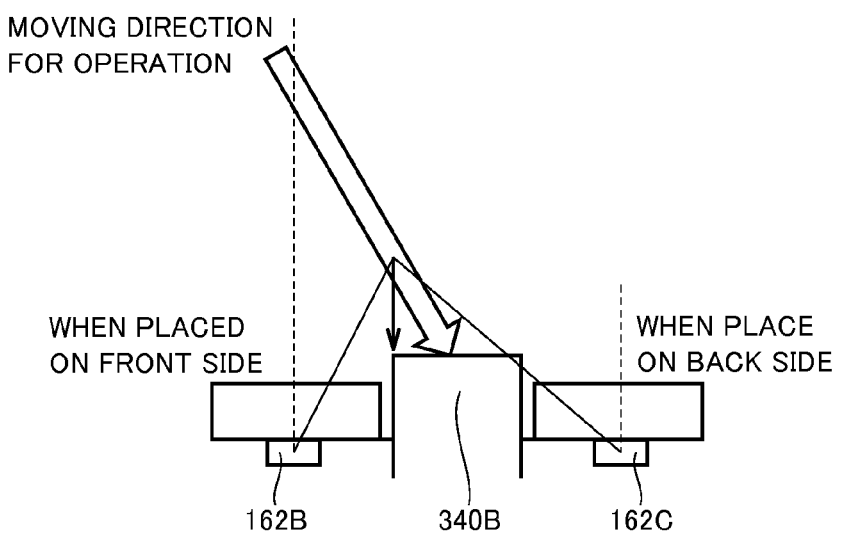
FIG. 13 illustrates arrangement of antennas in accordance with a modification of the embodiment of the present invention.

FIG. 13 illustrates arrangement of antennas in accordance with a modification of the embodiment of the present invention.

Referring to FIG. 13, here, part of the schematic cross-section of the operation panel taken along the line B-B' is shown. In this example, antennas 162B and 162C as conductive lines having a wire-shape, for example, are arranged adhered to a housing (resin case) provided to cover the printed circuit board.

By this structure, the distance to the operating finger approaching the operation key group and the like becomes shorter than when antennas 162B and 162C are provided on the printed circuit board and, hence, detection sensitivity can be improved.

Here, in order to stably hold the housing, separate holding means may be provided.

In the present example, the antennas corresponding to operation key groups are arranged in the vicinity, such that the operating finger to operate the corresponding key group crosses the antenna. Specifically, the antennas are arranged on the front side with respect to the expected direction of movement of the operating finger. By such an arrangement, it becomes possible to more quickly detect the operating finger than when the antennas are arranged on the back side, and detection sensitivity can be improved.

Figure 14:
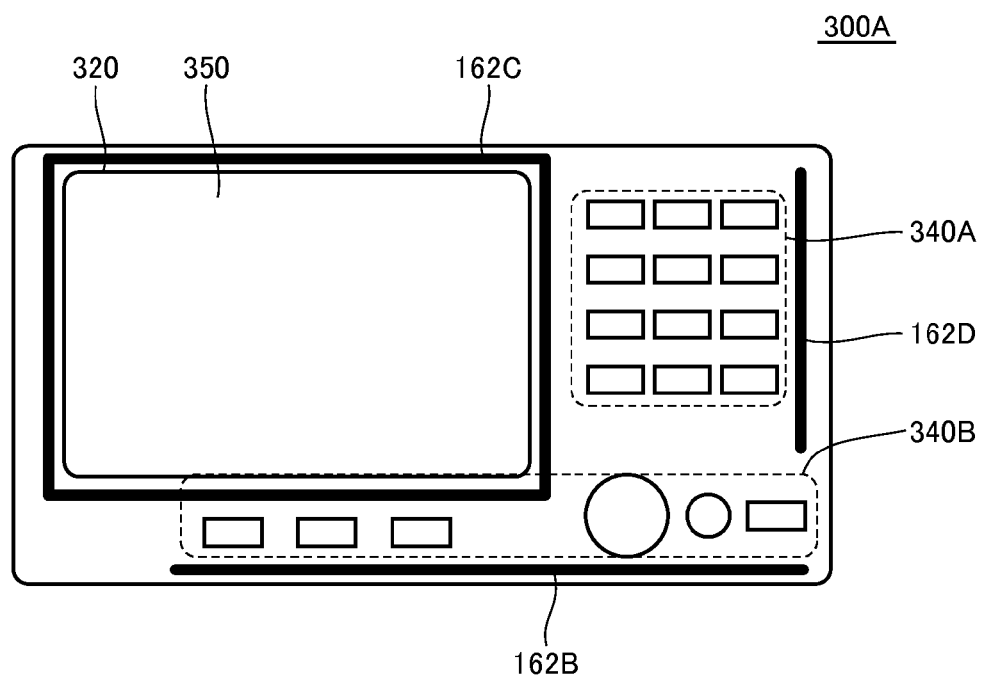
FIG. 14 shows another example of locations where antennas 162 are arranged corresponding to human detection sensor 160 in accordance with the embodiment of the present invention.

FIG. 14 shows another example of locations where antennas 162 are arranged corresponding to human detection sensor 160 in accordance with the embodiment of the present invention.

Referring to FIG. 14, operation panel 300A includes operation keys 340 (operation key groups 340A, 340B), touch-panel 350 attached to display 320, and antennas 162D, 162B and 162C connected to human detection sensor 160.

Antenna 162C is arranged to surround an outer periphery of display 320, and it can detect a user who is going to press touch-panel 350. The pattern of arrangement is not limited to the above, and antenna 162C may be arranged in a rectangular shape with one side opened, or in an L shape.

Antenna 162D is arranged opposite to one side of antenna 162C, such that operation key group 340A is positioned between antenna 162D and said one side of antenna 162C. Human detection sensor 160 connected to antenna 162D can detect a user who is going to press operation key group 340A. The pattern of arrangement is not limited to the above, and antenna 162D may fully surround the four sides of operation key group 340A.

Antenna 162B is arranged on a lower side along operation key group 340B. Human detection sensor 160 connected to antenna 162B can detect a user who is going to press operation key group 340B. The pattern of arrangement is not limited to the above, and antenna 162B may fully surround the four sides of operation key group 340B.

Figure 15:
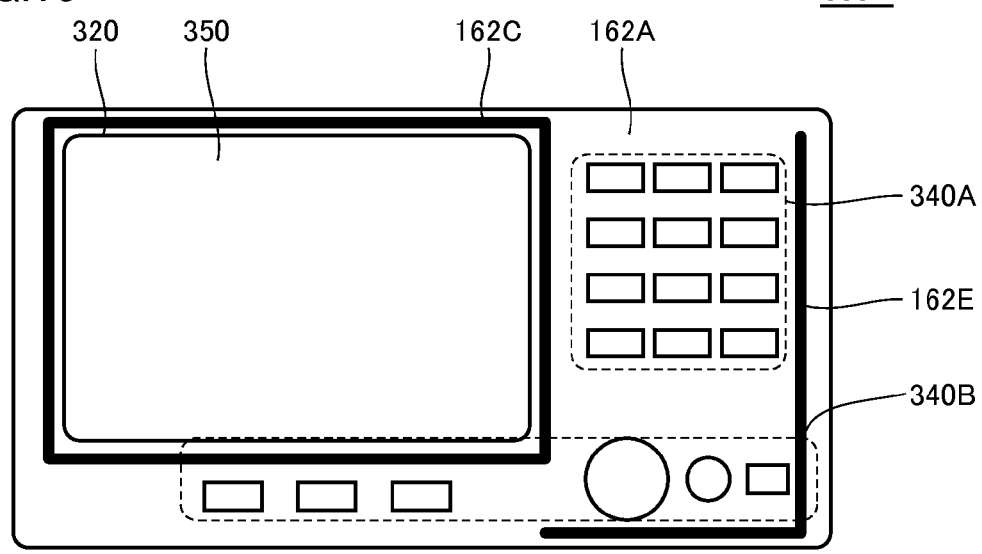
FIG. 15 shows a further example of locations where antennas 162 are arranged corresponding to human detection sensor 160 in accordance with the embodiment of the present invention.

FIG. 15 shows a further example of locations where antennas 162 are arranged corresponding to human detection sensor 160 in accordance with the embodiment of the present invention.

Referring to FIG. 15, operation panel 300B includes operation keys 340 (operation key groups 340A, 340B), touch-panel 350 attached to display 320, and antennas 162E and 162C connected to human detection sensor 160.

Antenna 162C is arranged to surround an outer periphery of display 320, and it can detect a user who is going to press touch-panel 350. The pattern of arrangement is not limited to the above, and antenna 162C may be arranged in a rectangular shape with one side opened, or in an L shape.

Antenna 162E is arranged in an L shape to detect user operation to operation key group 340A and part of operation key group 340B.

As for the remaining part of operation key group 340B, user operation is detected by antenna 162C. Since a plurality of operation key groups are covered by one antenna for detection, antenna layout can be made simple.

Figure 16:
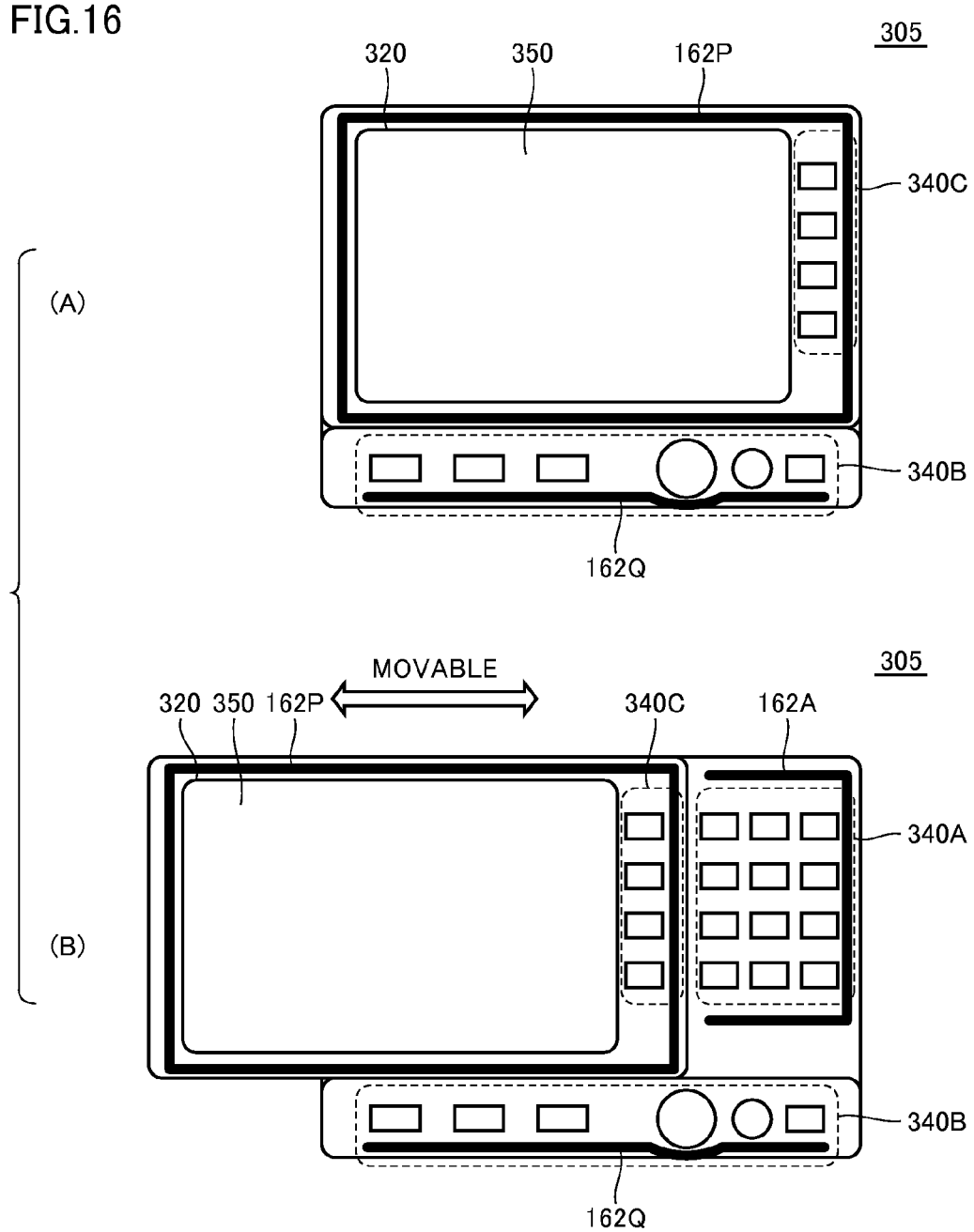
FIG. 16 is a schematic illustration of another operation panel 305 in accordance with the embodiment of the present invention.

FIG. 16 is a schematic illustration of another operation panel 305 in accordance with the embodiment of the present invention.

Referring to (A) and (B) of FIG. 16, here, an example of a movable operation panel 305 is shown.

FIG. 16(A) shows a state in which operation key group 340A is housed behind display 320. FIG. 16(B) shows a state in which display 320 is slid to enable operation of operation key group 340A.

As shown in FIG. 16(A), an antenna 162P is provided corresponding to touch-panel 350 and operation key group 340C, to surround the outer periphery of these. Further, an antenna 162Q is provided corresponding to operation key group 340B, along the arrangement of operation keys of operation key group 340B. It is noted that antenna 162Q need not be provided as a line, and it may be bent to confirm to the shape of operation keys.

Further, as shown in FIG. 16(B), antenna 162A is provided corresponding to operation key group 340A, to surround operation key group 340A in a rectangular shape with one side opened.

Except for these portions, the example is the same as those described above. Therefore, detailed description thereof will not be repeated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An image forming apparatus having, as operation modes, a normal mode and a power-saving mode with power consumption smaller than said normal mode, comprising:
    an operation unit for receiving an instruction from a user, said operation unit having an operation area to which a prescribed instruction from the user is input;
    a first detection unit, arranged corresponding to said operation area, for detecting an input from the user to said operation area in said normal mode;
    a power control unit controlling power supply in said normal mode and said power-saving mode, and turning off power supply to said first detection unit in said power-saving mode; and
    a second detection unit for detecting an input from the user to said operation area in said power-saving mode; wherein
    said operation unit has a plurality of operation areas; and
    said second detection unit is provided for each of said plurality of operation areas.

2. The image forming apparatus according to claim 1, wherein
    said second detection unit includes a detection antenna and a detection circuit connected to said detection antenna;
    said detection antenna is provided close to and corresponding to each of said plurality of operation areas provided in said operation unit; and
    said detection antenna detects an operating finger entering each of said plurality of operation areas of said operation unit.

3. The image forming apparatus according to claim 1, wherein
    said second detection unit includes a detection antenna and a detection circuit connected to said detection antenna;
    said operation unit has a first operation area provided with a touch-panel, and a second operation area provided with a prescribed group of keys;
    said detection antenna is arranged to surround outer peripheries of said first and second operation areas; and
    said detection antenna detects an operating finger entering each of said first and second operation areas.

4. The image forming apparatus according to claim 3, wherein
    said detection antenna is arranged such that said operating finger passes over said detection antenna, considering direction of the operating finger entering said operation area.

5. The image forming apparatus according to claim 1, wherein
    said second detection unit includes a detection antenna and a detection circuit connected to said detection antenna;
    said operation unit has a first operation area provided with a first group of keys and a second operation area provided with a second group of keys; and
    said detection antenna detects an operating finger entering said first and second operation areas.

6. The image forming apparatus according to claim 1, wherein
    said second detection unit includes a detection antenna and a detection circuit connected to said detection antenna;
    said operation unit has a first operation area provided with a touch panel and a second operation area provided with a prescribed group of keys; and
    said detection antenna has a first sub detection antenna arranged to surround an outer periphery of said first operation area, and a second sub detection antenna arranged to surround an outer periphery of said second operation area except for a side adjacent to said first operation area.

7. The image forming apparatus according to claim 1, wherein
    said second detection unit includes a detection antenna and a detection circuit connected to said detection antenna;
    said operation unit has a first operation area provided with a touch panel and a second operation area provided with a prescribed group of keys; and
    said detection antenna has a first sub detection antenna arranged to surround an outer periphery of said first operation area, and a second sub detection antenna arranged opposite to said first sub detection antenna so that said second operation area is positioned between these sub detection antennas.

8. The image forming apparatus according to claim 7, wherein
    the first operation area provided with said touch-panel is configured to be slidable.

9. The image forming apparatus according to claim 1, wherein
    said second detection unit includes a detection antenna and a detection circuit connected to said detection antenna; and
    said detection antenna is formed on the same printed circuit board as said first detection unit.

10. The image forming apparatus according to claim 1, wherein
    said second detection unit includes a detection antenna and a detection circuit connected to said detection antenna;
    said detection antenna is formed of a wire-like conductive body; and
    said detection antenna is arranged to be adhered to a resin case covering a printed circuit board on which said first detection unit is provided.

11. The image forming apparatus according to claim 1, further having, as said operation mode, a second power-saving mode with power consumption smaller than said normal mode and larger than said power-saving mode;
    said operation unit has a display unit for displaying information; and
    said power control unit supplies power to said first detection unit and turns off power supply to said display unit, in said second power-saving mode.

12. The image forming apparatus according to claim 1, wherein
    said power control unit turns off power supply to said second detection unit in said normal mode.

* * * * *